(12) United States Patent
Yokota et al.

(10) Patent No.: US 6,312,829 B1
(45) Date of Patent: Nov. 6, 2001

(54) EPOXY RESIN AND RESIN-SEALED TYPE SEMICONDUCTOR APPARATUS

(75) Inventors: Akira Yokota; Nobuyuki Nakajima, both of Ibaraki (JP)

(73) Assignee: Sumitomo Chemical Company, Limited, Osaka (JP)

( * ) Notice: Subject to any disclaimer, the term of this patent is extended or adjusted under 35 U.S.C. 154(b) by 0 days.

(21) Appl. No.: 09/469,173

(22) Filed: Dec. 21, 1999

(30) Foreign Application Priority Data

Dec. 24, 1998 (JP) .................................................. 10-367304

(51) Int. Cl.$^7$ ...................................................... H01L 29/12
(52) U.S. Cl. ............................ 428/620; 257/793; 523/466
(58) Field of Search ............................ 257/793; 428/620; 523/466; 549/544, 545

(56) References Cited

FOREIGN PATENT DOCUMENTS

| | | |
|---|---|---|
| 739877 * | 10/1996 | (EP) . |
| 62-275120 | 11/1987 | (JP) . |
| 63-225621 | 9/1988 | (JP) . |
| 1-121354 | 5/1989 | (JP) . |
| 1-131273 | 5/1989 | (JP) . |
| 1-190722 | 7/1989 | (JP) . |
| 2-88628 | 3/1990 | (JP) . |
| 3-21627 | 1/1991 | (JP) . |
| 3-47826 | 2/1991 | (JP) . |
| 4-220422 | 8/1992 | (JP) . |
| 4-318017 | 11/1992 | (JP) . |
| 6-211962 | 8/1994 | (JP) . |

* cited by examiner

Primary Examiner—Robert Dawson
Assistant Examiner—D. Aylward
(74) Attorney, Agent, or Firm—Fitch, Even, Tabin & Flannery

(57) ABSTRACT

Provided is a novolak epoxy resin having a GPC area percentage of a binuclear compound of 15% or more. Said novolak epoxy resin has a low viscosity and is useful for an electric and electronic material such as adhesives, paints, insulating materials, laminates and the like.

10 Claims, No Drawings

EPOXY RESIN AND RESIN-SEALED TYPE SEMICONDUCTOR APPARATUS

BACKGROUND OF THE INVENTION

1. Technical Field of the Invention

The present invention relates to novolak epoxy resins having low viscosity which are useful as electric and electronic materials such as adhesives, paints, insulating materials, laminates and the like, epoxy resin compositions using such resins, and resin-sealed type semiconductor apparatuses.

2. Description of the Related Art

As an epoxy resin used as an electric and electronic material, particularly as an epoxy resin used for insulating a semiconductor element, there are known phenols novolak epoxy resins such as ortho cresol novolak resins and the like. On the other hand, recently, there is conducted a method in which an epoxy resin having low viscosity is used in an epoxy resin composition having high filler content, along with change in form of a semiconductor package such as reduction in thickness thereof and the like. For example, epoxy resins having low viscosity such as di-functional biphenyl epoxy resins and the like are used recently. Also, regarding phenols novolak epoxy resins typically including an ortho cresol novolak resin, a technology has been developed for obtaining an epoxy resin having sharp molecular distribution in which the binuclear compound content is low and the tri- to hexa-nuclear compound content is high, and epoxy resins have been obtained having low viscosity and high heat-resistance simultaneously. Technologies for obtaining such an epoxy resin having sharp molecular distribution in which the tri- to hexa-nuclear compound content is high are described in Japanese Patent Application Laid-Open (JP-A) Nos. 1-190722, 2-88628, 4-220422, 9-216932 and the like.

Conversely, as the novolak epoxy resin having high binuclear compound content, epoxy resins having low softening temperature are commercially available. For example, as such an ortho cresol novolak epoxy resin, "SUMIEPOXY ESCN-195LL" (trade name: manufactured by Sumitomo Chemical Co., Ltd.) and the like are known. In actuality, when this ortho cresol novolak epoxy resin is used for example in an epoxy resin composition for insulating a semiconductor wherein filler content is high in the composition, sufficiently low viscosity is not obtained.

SUMMARY OF THE INVENTION

The object of the present invention is to provide a novolak epoxy resin having low viscosity which is useful as an electric and electronic material such as adhesives, paints, insulating materials, laminates and the like, an epoxy resin composition containing such a resin, and a resin-sealed type semiconductor apparatus.

According to the present invention, there is provided a novolak epoxy resin such as an ortho cresol novolak epoxy resin or the like having a GPC (gel permeation chromatography) area percentage of a binuclear compound of 15% or more, particularly 30% or more.

Also, there is provided, according to the present invention, an epoxy resin composition comprising as an essential component (A) an epoxy resin containing the above-described epoxy resin having specific ratio of a binuclear compound, and (B) an epoxy curing agent, and further, if necessary, (C) an inorganic filler.

Further, there is provided, according to the present invention, a resin-sealed type semiconductor apparatus which is produced by sealing a semiconductor element by curing the above-described epoxy resin composition containing the components (A) to (C).

DETAILED DESCRIPTION OF THE INVENTION

The epoxy resin of the present invention is a novel novolak type epoxy resin of low viscosity, which has a GPC area percentage of a binuclear compound of 15% or more, particularly 30% or more, and preferably, is an ortho cresol novolak epoxy resin. The viscosity of the epoxy resin of the present invention is usually 1 poise or less, preferably 0.5 poise or less at 150° C.

Herein, the binuclear compound means a unit wherein a unit obtained by reacting two molecules of phenols with one molecule of aldehydes or ketones has been epoxidized, among novolaks obtained by reacting phenols with aldehydes or ketones. For example, in the case of an ortho cresol novolak epoxy resin, the following structural unit is basically a binuclear compound.

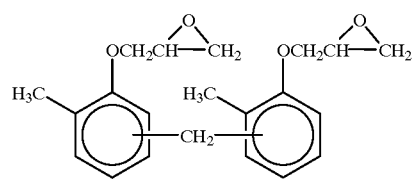

Alternatively, when phenols are represented by

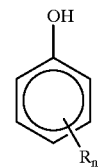

and aldehydes or ketones are represented by

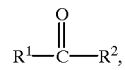

a binuclear compound of an epoxy resin obtained by reacting them can be represented by the following structural formula,

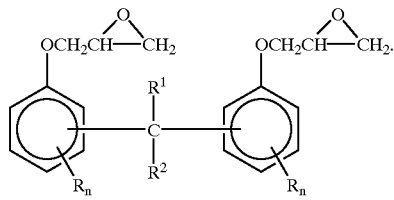

In the above formulas, Examples of R, $R^1$ and $R^2$ are exemplified as follows.

Examples of R include, without being limited thereto, an alkyl group having 1–20 carbon atoms, an aryl group having 6–20 carbon atoms and a halogen atom. The symbol of n represents an integer from 0 to 4.

Examples of $R^1$ and $R^2$ include, without being limited thereto, hydrogen atom, an alkyl group having 1–20 carbon atoms, an aryl group having 6–20 carbon atoms and a halogen atom.

In the epoxy resin of the present invention, measurement of the GPC area percentage of a binuclear compound can be conduced for example by the following method.

First, conditions for measuring GPC of an epoxy resin are as follows.

Apparatus: GPC (LC-10A) manufactured by Shimadzu Corp.

Guard Column: TSK guard column $H_{XL}$-L (6.0 mm $\phi \times 4.0$cm)

| Column: TSK gel | $G3000H_{XL}$ (7.8 mm $\phi$ × 30 cm) |
| --- | --- |
| | $G2000H_{XL}$ (7.8 mm $\phi$ × 30 cm) |
| | $G1000H_{XL}$ (7.8 mm $\phi$ × 30 cm) |
| | three coloumns are connected in total |

Moving Phase: tetrahydrofuran (guaranteed reagent, containing an additive)

Flow Rate: 1 ml/min, Detection: RI detector, Injection Amount: 30 μl, Column Temperature: 40° C.

Sample Concentration: 0.15 g/10 ml (tetrahydrofuran solution)

The GPC area percentage of a binuclear compound can be obtained by measuring the area percentage of a peak of the binuclear compound emerging around 25 to 26 minutes on GPC measured under the measuring conditions described above.

The viscosity of the epoxy resin of the present invention is a value measured at 150° C. using a commercially available parallel plate type viscometer (trade name "CVO rheometer", manufactured by Bohlin Instruments).

A method for preparing the epoxy resin of the present invention is not particularly restricted, and it can be obtained, for example, by a method in which phenols and aldehydes or ketones are subjected to a condensation reaction in the presence of an acid catalyst while controlling charging ratio of those raw materials to obtain novolaks, then, the novolaks are epoxidized, as well as other methods. The epoxy resin can also be obtained by a method in which the amount of compounds other than a binuclear compound of novolaks obtained by known methods is reduced by column treatment, heating and distillation in vacuo, and the like, then, the novolaks are epoxidized, as well as other methods.

Examples of the above-describedphenols include, but are not limited to, phenol, cresol, xylenol, trimethylphenol, methylethylphenol, methylpropylphenol, methylisobutylphenol, methylhexylphenol, methylcyclohexylphenol (including isomers, respectively), 3-methyl-6-t-butylphenol and the like. From the standpoints of easy availability and cost, phenol, cresol, xylenol and 3-methyl-6-t-butylphenol are preferable. These phenols may be used alone or in combination of two or more.

Examples of the above-described aldehydes or ketones include, but are not limited to, formaldehyde, acetaldehyde, acetone, cyclohexanone and the like. Any of them may also be provided in the form of an aqueous solution and the like.

As the above-described acid catalyst, there are exemplified inorganic acids such as fuming sulfuric acid, conc. sulfuric acid, aqueous sulfuric acid solution, conc. hydrochloric acid, hydrogen chloride gas, trifluorosulfonic acid and the like; organic acids such as p-toluenesulfonic acid, chloroacetic acid, trichloroacetic acid, trifluoroacetic acid and the like; heteropolyacid, acidic ion exchange resin and the like, and p-toluenesulfonic acid is suitably used.

Novolak formation by a condensation reaction can be conducted, for example, by adding dropwise aldehydes or ketones into a mixture of phenols and an acid catalyst, stirring the mixture while keeping the temperature, then, removing the acid catalyst by water washing and the like, and removing by distillation unnecessary solvents such as water and the like. Herein, the condensation reaction can be conducted under ordinary conditions.

For obtaining novolaks, raw materials of the epoxy resin of the present invention, there is used for example a method in which charging ratio in the condensation reaction of the phenols with the aldehydes or ketones is controlled, however, the method for obtaining novolaks is not limited to this method. Specifically, the charging ratio of phenols can be increased appropriately depending on the kind thereof so that the ratio of the GPC area percentage of a binuclear compound in the resulting epoxy resin is over the above-described ratio. For example, in the case of raw materials for obtaining an ortho cresol novolak epoxy resin, when cresol is used as the phenol and formalin is used as the aldehydes, the charging ratio of formalin/cresol is preferably 0.6 or less, particularly preferably 0.5 or less by weight.

Epoxidization of the novolaks can be conducted by known methods such as a method in which epichlorohydrine is reacted, as well as other methods.

Specifically, for example, epichlorohydrine is first charged in a reaction vessel together with the novolaks for dissolving the novolaks. With continuously adding aqueous solution of sodium hydroxide dropwise, reaction is proceeded with returning the organic phase to the reaction system. Here, epichlorohydrine and water under azeotropy are cooled and liquefied. The resulted reaction mixture can be purified by post treatment such as water washing and the like to obtain a desired material. The reaction conditions in this operation can be appropriately determined according to an ordinary method.

The measurement of the GPC area percentage of the binuclear compound in the obtained epoxy resin, can be conducted as described above.

The epoxy resin composition of the present invention comprises as an essential component (A) an epoxy resin containing the above-described epoxy resin having specific ratio of a binuclear compound, and (B) an epoxy curing agent, and further, if necessary, (C) an inorganic filler.

The component (A) may advantageously contains the above-described epoxy resin of the present invention having a specific ratio of a binuclear compound, and can be used together with other epoxy resin. Examples of the other epoxy resin include epoxy resins other than the epoxy resin of the present invention derived from condensates of aldehydes or ketoneswithphenol, cresols, xylenols, methyl-t-butylphenol, naphthol, dihydroxybenzene, dihydroxynaphthalene (including various isomers); glycidyl ether epoxy resins derived from bisphenols such as bisphenol A, bisphenol F, biphenol, tetramethylbiphenol, stilbenediols and the like; glycidyl ether epoxy resins derived from hydroxybenzaldehydes and polyvalent phenols composed of various phenols; glycidyl ether epoxy resins derived from polyvalent phenols other than raw materials of the epoxy resin of the present invention such as phenolnovolak, cresolnovolak, resorcinolnovolak and the like; amine epoxy resins derived from aminophenol, aminocresol, diaminodiphenylmethane and the like; alicyclic epoxy resins, and the like. These epoxy resins can be used alone or in combination of two or more.

As the other epoxy resins, preferable is such an epoxy resin having high crystallinity, or an epoxy resin having low compatibility with the epoxy resin of the present invention in view of handling property. Preferable examples are glycidyl ether epoxy resins derived from bisphenols such as biphenol, tetramethylbiphenol, stilbenediols and the like.

The content of the epoxy resin of the present invention having the specific ratio of a binuclear compound, in the component (A) differs depending on the object and extent of the expected effect and is not particularly restricted, and preferably from 10 to 100% by weight, particularly preferably from 50 to 100% by weight.

Examples of the epoxy curing agent (B) used in the composition of the present invention include, but are not limited to, various acid anhydride curing agents, amine curing agents, phenol curing agents and the like. These are used alone or in combination of two or more.

Examples of the acid anhydride curing agent include, but are not limited to, tetrahyro phthalic anhydride, methyl tetrahyro phthalic anhydride, hexahyro phthalic anhydride, methylhexahyro phthalic anhydride, dodecenyl succinic anhydride, nadic anhydride, methylnadic anhydride, phthalic anhydride, pyromellitic anhydride, benzophenonetetracarboxylic anhydride, methylcyclohexenetetracarboxylic anhydride, 3,4-dicarboxy-1,2,3,4-tetrahydro-1-naphthalenesuccinic dianhydride, 1-methyl-3,4-dicarboxy-1,2,3,4-tetrahydro-1-naphthalenesuccinic dianhydride and the like.

Examples of the amine curing agent include, but are not limited to, diethylenetriamine, triethylenetetramine, dicyanediamide, diaminodiphenylmethane, diaminodiphenylsulfone and the like.

Examples of the phenol curing agent include polycondensates of one or more than one phenols such as phenol, various alkylphenols, naphthol and the like with aldehydes such as formaldehyde, acetaldehyde, acrolein, glyoxal, benzaldehyde, naphthoaldehyde, hydroxybenzaldehyde and the like or ketones such as cyclohexanone, acetophenone and the like; vinyl polymerization type polyvalent phenols such as polyvinylphenol, polyisopropenylphenol and the like, as well as other compounds.

In the composition of the present invention, regarding the compounding ratio of the epoxy resin (A) with the epoxy resin curing agent (B), it is usually preferable to compound the epoxy resin curing agent (B) in a ratio of 0.7 to 1.2 equivalents per one equivalent of an epoxy group in the epoxy resin (A). The ratio of less than 0.7 equivalents or over 1.2 equivalents is not preferable since curing is incomplete in any case.

In the composition of the present invention, examples of the inorganic filler (C) include silica, alumina, titanium white, aluminum hydroxide, talc, clay, glass fiber and the like. Inorganic fillers having different forms (spherical or crushed form) or sizes can also be mixed for increasing filling amount to be used.

The compounding ratio, when the inorganic filler (C) is used, is preferably from 40 to 95% by weight, more preferably from 70 to 95% by weight based on the total amount of the composition, though it differs depending on the object.

In the epoxy resin composition of the present invention, various additives such as a curing accelerator, flame retardant, silane coupling agent, liquid rubber, coloring agent, solvent and the like can also be added and compounded appropriately in a compounding ratio corresponding to use thereof and the like, according to use and use intention.

Examples of the curing accelerator include, but are not limited to, organic phosphine compounds such as triphenylphosphine, tri-4-methylphenylphosphine, tri-4-methoxyphenylphosphine, tributylphosphine, trioctylphosphine, tri-2-cyanoethylphosphine and the like, and tetraphenylborate salts thereof; tertiary amines such as tributylamine, triethylamine, 1,8-diazabicyclo(5.4.0)undecene-7, triamylamine and the like; quaternary ammonium salts such as benzyltrimethylammonium chloride, benzyltrimethylammonium hydroxide, triethylammonium tetraphenylborate and the like; imidazoles, and the like.

Examples of the flame retardant include a brominated epoxy resin, antimony trioxide and the like.

The conditions for curing the epoxy resin composition of the present invention can be appropriately determined depending on the kind, compounding ratio thereof, the kind of a catalyst and the like. The curing reaction can be conducted usually at a temperature from 100 to 200° C. for 1 to 24 hours.

The resin sealed-type semiconductor apparatus of the present invention is an apparatus which is produced by sealing a semiconductor element by curing an epoxy resin composition comprising the components (A) to (C) as an essential component, and semiconductor elements an the like other than the epoxy resin composition can be known materials for use.

The curing conditions of the epoxy resin composition are not particularly restricted providing a semiconductor element can be sealed, and the curing can be conducted usually under the above-described curing conditions.

EXAMPLES

The following examples further illustrated the present invention in detail but do not limit the scope thereof.

The GPC area percentage and viscosity of a binuclear compound in an epoxy resin shown in Table 1 were measured according to the above-described measuring conditions.

Evaluation of a kneaded article and cured molded article shown in Table 2 was conducted as shown below.

Spiral flow: It was measured under conditions of 175° C./70 kg/cm$^2$ according to EMMI-1-66.

Barcol hardness: It was measured under conditions of 175° C./90 seconds according to ASTM D-648.

Glass transition temperature: It was measured using DMA.

Bending property: It was measured by a tensile tester (SHIMADZU IS-10T) according to JIS K-6911.

Water absorption: It was measured under conditions of 85° C./85% RH using a thermo-hygrostat chamber.

Solder crack resistance: It was measured by crack generating rate when a simulated IC (52 pin QFP package: package thickness 205 mm) was allowed to absorb moisture under conditions of 85° C./85% RH, then, immediately immersed in a solder bath of 240° C. for 30 seconds.

Reference Example 1

Into a 1 L round bottom flask was charged 216.3 g (2 mol) of o-cresol, 1.9 g of p-toluenesulfonic acid and 7.6 g of water, and to this was added 97.4 g (1.2 mol) of 37 wt % formalin dropwise. The reaction was conducted at 90 to 100°

C., then, neutralization, dehydration treatment and de-cresol treatment were conducted to obtain an ortho cresol novolak resin. This ortho cresol novolak resin is called "Novolak 1".

Reference Example 2

An ortho cresol novolak resin was obtained in the same manner as in Reference Example 1 except that the amount of 37 wt % formalin to be added dropwise was 81.2 g (1.0 mol). This ortho cresol novolak resin is called "Novolak 2".

Reference Example 3

An ortho cresol novolak resin was obtained in the same manner as in Reference Example 1 except that the amount of 37 wt % formalin to be added dropwise was 73.1 g (0.9 mol). This ortho cresol novolak resin is called "Novolak 3".

Examples 1 to 3 and Comparative Example 1

Epoxydization was conducted using Novolaks 1 to 3 obtained in Reference Examples 1 to 3 as raw materials respectively. The epoxidization reaction was conducted according to the description of Japanese Patent Application Publication (JP-B) No. 62-26647, as described below.

Namely, first, epichlorohydrine was charged in a reaction vessel together with the ortho cresol novolak resins and dioxane for dissolving the ortho cresol novolak resins. Then, the reaction was proceeded with returning the organic phase to the reaction system, that is, with cooling and liquifying epichlorohydrine and water under azeotropy, while continuously adding sodium hydroxide dropwise. After the completion of the reaction, the organic solvent was removed by condensation under reduced pressure, dissolved in methyl isobutyl ketone, and a by-produced salt was removed by water washing. Then, methyl isobutyl ketone was removed by condensation under reduced pressure to obtain desired epoxy resins respectively.

The resulted epoxy resins are called "Epoxy 1", "Epoxy 2" and "Epoxy 3", respectively in this order. The GPC area percentages and viscosities of binuclear bodies of these epoxy resins and an ortho cresol novolak epoxy resin having low softening temperature ("ESCN-195LL": trade name, manufactured by Sumitomo Chemical Co., Ltd., hereinafter referred to as "Epoxy 4") were measured and compared. The results are shown in Table 1.

TABLE 1

|  | Formalin/cresol charging ratio | GPC area percentage of binuclear compound | Viscosity (150° C.) |
| --- | --- | --- | --- |
| Epoxy 1 | 0.6 | 20.0% | 0.63 poise |
| Epoxy 2 | 0.5 | 33.7% | 0.33 poise |
| Epoxy 3 | 0.45 | 41.4% | 0.25 poise |
| Epoxy 4 | — | 12.5% | 1.36 poise |

Examples 4 to 6 and Comparative Example 2

Epoxy 1 to 3 prepared in Examples 1 to 3 and Epoxy 4 used in Comparative Example 1 were heated and kneaded by a roll then transfer-molded, using a phenol aralkyl resin (Mirex XL: trade name, manufactured by Mitsui Toatsu Chemicals, Inc.) as a curing agent, triphenylphosphine as a curing accelerator and fused silica as a filler, while compounding carnauba wax as a releasing agent and a coupling agent (SH-6040: trade name, manufactured by Dow Corning Toray Silicone Co., Ltd.) in formulations as shown in Table 2. As the above-described fused silica, a mixture prepared by mixing 10% by weight of a crushed silica ("FS-20": trade name, average particle size: 5.6 μm, manufactured by Denki Kagaku Kogyo K. K.), 10.8% by weight of a spherical silica ("Adma Fine SO-C2": trade name, average particle size: 0.4 μm, manufactured by Adma Teck K.K.), 18% by weight of a spherical silica (Silstar-MK-06: trade name, average particle size: 4.9 μm, manufactured by Nippon Chemical Industrial Co., Ltd.) and 61.2% by weight of a spherical silica (Eccerica SE-40: trade name, average particle size: 40.4 μm, manufactured by Tokuyama Soda Co., Ltd.) was used, and used as a filler in a compounding amount shown in Table 2.

From the results shown in Table 2, it is known that Examples 4 to 6 provide excellent results in abilities such as spiral flow, package crack resistance and the like as compared with Comparative Example 2.

TABLE 2

|  |  | Example 4 | Example 5 | Example 6 | Comparative example 2 |
| --- | --- | --- | --- | --- | --- |
| Compounding | | | | | |
| Epoxy resin | Epoxy 1 | 100 | — | — | — |
|  | Epoxy 2 | — | 100 | — | — |
|  | Epoxy 3 | — | — | 100 | — |
|  | Epoxy 4 | — | — | — | 100 |
| Part by weight | | | | | |
| Curing agent | Mirex XL | 88 | 88 | 91 | 84 |
| Catalyst | TPP | 2.5 | 2.5 | 2.5 | 2.5 |
| Silica filler |  | 1381 | 1377 | 1399 | 1349 |
| Wax | Carnauba wax | 3.3 | 3.4 | 3.5 | 3.3 |
| Coupling agent | SH-6040 | 4.6 | 4.5 | 4.6 | 4.5 |
| Storage stability | | | | | |
| Spiral flow (inch) | 0 day | 24.0 | 33.5 | 36.2 | 20.5 |
|  | 1 day | 23.1 | 31.4 | 32.6 | 20.1 |
|  | 4 days | 18.0 | 22.1 | 23.0 | 15.1 |
|  | 7 day | 16.0 | 19.1 | 20.6 | 14.6 |
| Barcol hardness |  | 87.0 | 85.5 | 85.0 | 87.0 |

TABLE 2-continued

|  |  | Example 4 | Example 5 | Example 6 | Comparative example 2 |
|---|---|---|---|---|---|
| | Bending test | | | | |
| Room temperature | Strength (kg/mm$^2$) | 18.61 | 17.42 | 17.51 | 18.71 |
| | Elastic modulus (kg/mm$^2$) | 2564.9 | 2581.6 | 2589.9 | 2564.3 |
| | Flexure (%) | 0.828 | 0.761 | 0.771 | 0.830 |
| Heating at 240° C. | Strength (kg/mm$^2$) | 1.36 | 1.08 | 1.06 | 1.45 |
| | Elastic modulus (kg/mm$^2$) | 111.8 | 79.0 | 79.7 | 115.3 |
| | Flexure (%) | 1.04 | 1.17 | 1.16 | 1.06 |
| | Water absorption measuring level 1 | | | | |
| Package (168 hr) (%) | | 0.213 | 0.214 | 0.205 | 0.215 |
| Disk | 16 hr (%) | 0.054 | 0.051 | 0.054 | 0.055 |
| | 20 hr (%) | 0.061 | 0.059 | 0.060 | 0.063 |
| | 24 hr (%) | 0.067 | 0.065 | 0.066 | 0.069 |
| | 48 hr (%) | 0.101 | 0.099 | 0.100 | 0.104 |
| | 72 hr (%) | 0.128 | 0.122 | 0.124 | 0.127 |
| | 168 hr (%) | 0.178 | 0.180 | 0.182 | 0.181 |
| | 336 hr (%) | 0.217 | 0.221 | 0.224 | 0.220 |
| | Solder crack (standard type level 1) | | | | |
| Internal crack | | 6/9 | 0/10 | 0/9 | 6/10 |
| External crack | | 0/9 | 0/10 | 0/9 | 0/10 |
| Tg | RDA (° C.) | 126.4 | 112.4 | 110.6 | 180.3 |

The epoxy resin of the present invention can provide low viscosity property and is useful as an electric and electronic material such as an adhesive, paint, insulation material, laminate or the like since the content of a binuclear compound in this epoxy resin is controlled to high level as compared with conventional epoxy resins, and an epoxy resin composition containing this resin is extremely useful in the above-described electric and electronic material and a resin sealed-type semiconductor apparatus.

What is claimed is:

1. A novolak epoxy resin having a GPC area percentage of a binuclear compound of 15% or more, wherein the novolak epoxy resin is an ortho cresol novolak epoxy resin.

2. The novolak epoxy resin according to claim 1, wherein the GPC area percentage of a binuclear compound is 30% or more.

3. An epoxy resin comprising as an essential component:
   (A) an epoxy resin containing the epoxy resin of claim 1 or 2, and
   (B) an epoxy curing agent.

4. The epoxy resin composition according to claim 3, wherein said resin further comprises (C) an inorganic filler.

5. A resin-sealed semiconductor apparatus which is produced by sealing a semiconductor element with the epoxy resin composition according to claim 3.

6. A resin-sealed type semiconductor apparatus according to claim 5, wherein the epoxy resin used to seal said semiconductor element further comprises: (C) an inorganic filler.

7. A solid object obtained by curing an epoxy resin composition, which when not fully cured, comprises
   (A) an epoxy resin containing the epoxy resin according to claim 1 or 2 and
   (B) an epoxy curing agent.

8. A solid object according to claim 7, wherein the epoxy resin further comprises (C) an inorganic filler.

9. A method for sealing a semiconductor element comprising:
   sealing a semiconductor element using a composition comprised of an ortho cresol novolak epoxy resin having a GPC area percentage of a binuclear compound of 15% or more, a curing agent and an inorganic filler.

10. The method according to claim 9 wherein the GPC area percentage is 30% or more.

* * * * *